United States Patent [19]

Jaecklin et al.

[11] 4,305,085

[45] Dec. 8, 1981

[54] SEMICONDUCTOR COMPONENT WITH AT LEAST ONE PLANAR PN JUNCTION AND ZONE GUARD RINGS

[75] Inventors: André Jaecklin, Ennetbaden; Erich Weisshaar, Münzlishausen-Baden, both of Switzerland

[73] Assignee: BBC Brown, Boveri & Company, Limited, Baden, Switzerland

[21] Appl. No.: 76,671

[22] Filed: Sep. 18, 1979

[30] Foreign Application Priority Data

Oct. 11, 1978 [CH] Switzerland .................. 10539/78

[51] Int. Cl.$^3$ ........................................... H01L 29/34
[52] U.S. Cl. .................................... 357/52; 357/13; 357/38; 357/39
[58] Field of Search ..................... 357/52, 38, 39, 13

[56] References Cited

U.S. PATENT DOCUMENTS

| | | | |
|---|---|---|---|
| 3,911,473 | 10/1975 | Nienhuis | 357/52 |
| 3,971,061 | 7/1976 | Matsushita | 357/52 |
| 4,150,391 | 4/1979 | Jaecklin | 357/39 |
| 4,157,563 | 6/1979 | Bosselaar | 357/53 |

Primary Examiner—Martin H. Edlow
Attorney, Agent, or Firm—Oblon, Fisher, Spivak, McClelland & Maier

[57] ABSTRACT

A semiconductor component including at least one planar PN junction formed between a first semiconductor region and a second semiconductor region, zone guard rings surrounding the first region and surrounded by the second region in order to improve the reverse-current behavior of the PN junction, and a third semiconductor region having the same conductivity type as the second region, but having a higher doping concentration than the latter provided in the second region preceding the respective edges of the guard rings on the side of the PN junction. Typically the third region is doped such that with the PN junction polarized in the blocking direction, at least one point in the third region remains at zero field strength. Additionally provided is a fourth semiconductor region between the guard rings and between the guard ring closest the PN junction and the PN junction, which has the same conductivity type as the second region, but a lesser doping concentration.

4 Claims, 6 Drawing Figures

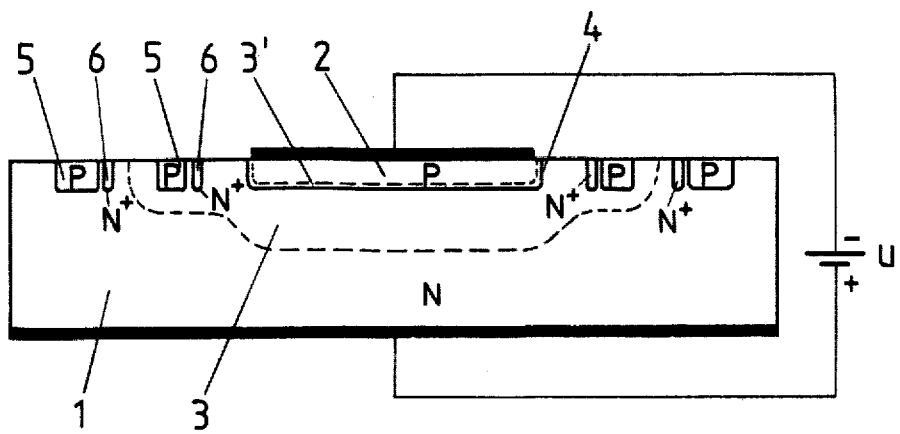
FIG. 1
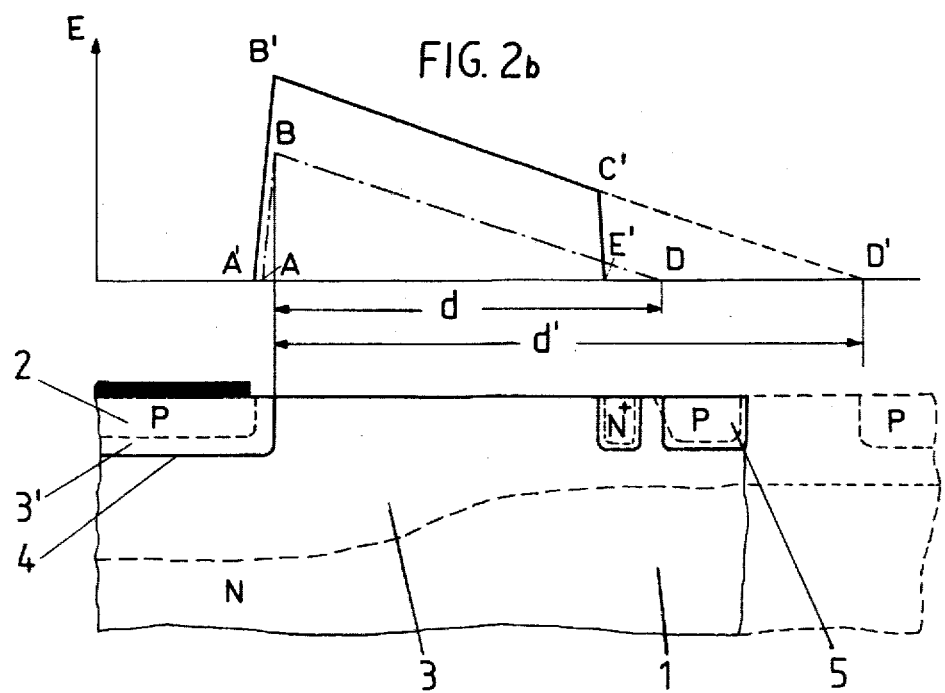
FIG. 2b
FIG. 2a

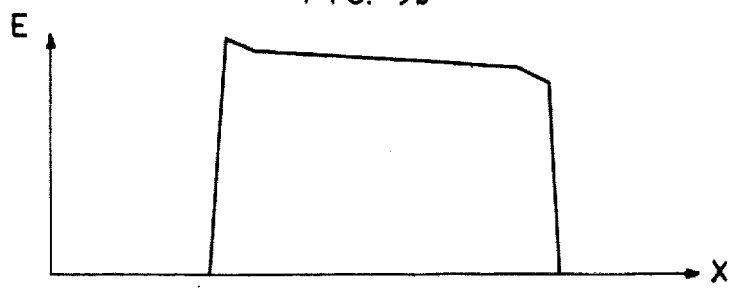
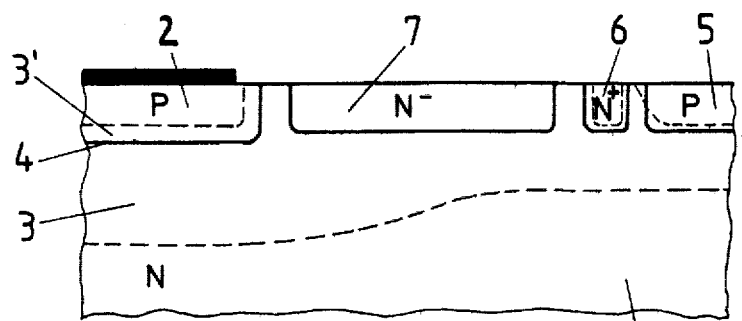
FIG. 3b
FIG. 3a
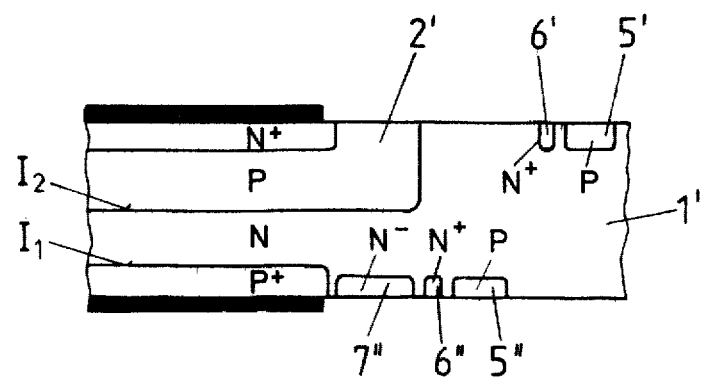
FIG. 4

SEMICONDUCTOR COMPONENT WITH AT LEAST ONE PLANAR PN JUNCTION AND ZONE GUARD RINGS

BACKGROUND OF THE INVENTION

1. Field of the Invention

This invention relates to semiconductor components having at least one planar PN junction, and more particularly to such components further having rings which are intended to effect an improvement in the reverse-current behavior of the PN junction.

2. Description of the Prior Art

Such semiconductor components of the type noted above described, for example, in the book by A. Blicher, "Thyristor Physics", Springer, New York 1976, pages 231-241. These known components have the disadvantage, however, that with reverse voltages greater or equal to 2 kV a plurality of guard rings are required which use up a correspondingly large portion of the active area of the component.

SUMMARY OF THE INVENTION

Accordingly, one object of this invention is to provide a novel semiconductor component of the type described above wherein, when compared to known components, either the number of the required guard rings or the distance of the guard rings with respect to one another can be reduced while maintaining the same reverse voltage.

This and other objects are achieved by providing a novel semiconductor component including at least one planar PN junction formed between a first semiconductor region and a second semiconductor region, zone guard rings surrounding the first region and surrounded by the second region in order to improve the reverse-current behavior of the PN junction, and a third semiconductor region having the same conductivity type as the second region, but having a higher doping concentration than the latter provided in the second region preceding the respective edges of the guard rings on the side of the PN junction. Typically the third region is doped such that with the PN junction polarized in the blocking direction, at least one point in the third region remains at zero field strength. Additionally, a fourth semiconductor region can be provided between the guard rings and between the guard ring closest the PN junction and the PN junction, which has the same conductivity type as the second region, but a lesser doping concentration.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a diagrammatic cross-sectional view of a diode polarized in the blocking direction, wherein the diode includes additional $N^{30}$ zones preceding the guard rings;

FIG. 2(a) is an enlarged cross-sectional view of the area of the diode according to FIG. 1 located between the PN junction and the first guard ring;

FIG. 2(b) is an illustration of the distribution of field strength in the area shown in FIG. 2(a);

FIG. 3(a) is an enlarged cross-sectional view illustrating the same area as FIG. 2 in which, apart from the N+ zone mentioned, another additional N− zone (a) is provided;

FIG. 3(b) is an illustration of the distribution of field strength in area shown in FIG. 3(a); and FIG. 4 is an illustration of an application of the structure according to the invention in a thyristor semiconductor device.

DESCRIPTION OF THE PREFERRED EMBODIMENTS

Referring now to the drawings, wherein like reference numerals designate identical or corresponding parts throughout the several views, and more particularly to FIG. 1 thereof, the semiconductor diode therein reproduced consists of a weakly doped N base region 1 with a doping concentration of, for example, $10^{14}$ cm$^{-3}$ and a P region 2 diffused into this base region and possessing a concentration of impurities which can be, for example, $10^{17}$ cm$^{-3}$ at the surface. Due to the considerably weaker concentration of impurities, the width of the depletion layer region 3 in the N region 1, measured from the PN junction 4, is considerably greater than that of the depletion layer region 3' in the P region 2. The guard rings 5 effect an additional widening of this depletion layer region along the surface of the component (see the initially quoted work by Blicher for the action of the guard rings). Accordingly to the invention, the respective edge of the guard rings 5 on the PN side is preceded by N+ region 6. The doping concentration of this region is, for example, $10^{17}$ cm$^{-3}$ at the surface of the component.

The action of the $N^{30}$ region 6 can particularly be seen in FIG. 2(b). The points A, B, D characterize the triangular shape of the field strength curve when no N+ region 6 is provided. Due to its high doping concentration, this additional N+ region 6 acting as a barrier layer now produces a trapezoidal field strength curve marked in FIG. 2(b) by the points A', B', C', E'. The voltage which can be accommodated, defined by the integral $\int E\,dx$ can, therefore, be considerably greater with the additional N+ region 6, as can be seen directly from FIG. 2(b), than with the known components without this region. If the distance between the P regions is compared, the N+ region effects a shortening of this distance, that is from d' to d. This makes it possible, therefore, to accommodate more guard rings on a given area than had been hitherto possible with the know semiconductor components (in favorable cases $d=(d'/2)$).

Thus, the new structure provides an advantageous solution particularly in all those cases in which hitherto guard ring structures were desirable, on the one hand, because, apart from reducing the field strength at the surface, they also reduced the effect of the curved PN junctions 4 but in which, on the other hand, the area required for the guard ring structure was too large.

As a rule, the width of the N+ region 6 is selected in such a manner that at least one point of this region always remains at zero-field strength. The width then is between approximately 10 μm and 200 μm. The same considerations also apply to the depth of the N+ regions, which is also usually between 10 μm and 200 μm measured from the surface of the component. In individual cases it may be useful, however, to deviate from the guide values given. For instance, if the purpose of adjusting the field strength curve exactly in the area of the points C', E' (FIG. 2b), the surface of the N+ region 6 must be etched again in order to reduce the doping concentration in this region. Another possibility for adjusting th corresponding value of field strength consists in producing, right from the start by means of corresponding masking with following diffusion N+ regions 6 which are so narrow that, although there is not longer a zero-field area in the N+ regions, in contrast to the dimensioning mentioned above, the field strength in the C', E' area shows the exact desired values.

The distance between the N+ region 6 and the guard ring 5 is not critical. It can be between 0 and about 50 μm.

With the structure reproduced in FIG. 3 the weakly doped N− region 7 provided additionally in this drawing can be used to achieve an even better approximation of a desired rectangular field distribution (see FIG. 3b). This region can fill either the while area or, as shown in FIG. 3(a), a portion of the area between the P region 2 and the N+ region 6.

The doping of the N− region 7 which is less in comparison to the N region 1 can be produced directly by out-diffusion or epitaxy. The doping concentration of this region can be adjusted indirectly by way of weak compensation of the impurities, either by means of ion implantation (combined with diffusion) or by P diffusion (possibly followed by etching off of a surface layer).

In order to prevent undersirably inversion channels from forming, the doping concentration of the N− region 7, however, should have a value at the surface which, according to the type of the passivating layer is greater than $10^{13}$–$10^{14}$ cm$^{-3}$.

With semiconductor components with an N base region 1 with a medium doping concentration of less than or equal to $10^{14}$ cm$^{-3}$ there is no sense, therefore, in providing an additional N− region 7. Rather, it can be useful in these cases to replace the N− region 7 by a $N_2^+$ region. The doping concentration of this region is, on the one hand, above the doping concentration of the N region 1. On the other hand, it is less than that of the N+ region. It is selected in such a manner that as high a value of $\Delta\mu = \cdot E \cdot dx$ as possible will result while maintaining a field strength which is still permissible. If this N+ layer fills the whole area between the P region 2 and the N+ region 6 this will suppress the formation of undesirable inversion channels.

The invention described is suitable not only for diodes but for any types of semiconductor components with PN-region junctions. For example, in FIG. 4 a cross-section through a part of a thyristor is shown. In order to improve the reverse-current behavior of the junction $I_2$ adapted to lock in the forward direction, a guard ring 5' and an N+ region 6' are provided at the surface of the N base 1'. On the other hand, in order to improve the reverse-current behavior of the blocking junction $I_1$ of importance in the reverse direction a guard ring 5", an N+ region 6" and an N− region 7" are provided.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a semiconductor component provided with a planar blocking PN junction suited to block reverse voltages greater or equal to 2 kV formed between a first semiconductor region and a second semiconductor region, said two regions forming a common main surface of said component such that said first region is surrounded by said second region and said PN junction emerges on said surface between said two regions, and with at least one ring zone at said surface in said second region of the same conductivity as said first region, said ring zone surrounding said PN junction but being separated from the latter by a ring-like part of said second region the improvement comprising:

at least one third semiconductor region having the same conductivity type as the second region, but having a higher doping concentration than the latter provided at said surface in said ring-like part of said second region between said PN junction and said ring zone.

2. A semiconductor component according to claim 1, further comprising:

said third semiconductor region having a doping concentration and width, selected such that with said PN junction polarized in the blocking direction at least one point of said third region remains at zero field strength, and the width of said third region being between 10 μm and 200 μm.

3. A semiconductor component according to claim 1, or 2, further comprising:

the distance of said third semiconductor region from the respective ring zone being between 0 and 50 μm.

4. A semiconductor component according to claim 1, further comprising:

a fourth semiconductor region which has the same type of conductivity but a lesser doping concentration than the second semiconductor region, said fourth region being provided between said PN junction and the first ring zone closest to said first region.

* * * * *